(12) United States Patent
Liu et al.

(10) Patent No.: US 12,284,759 B2
(45) Date of Patent: Apr. 22, 2025

(54) DISPLAY MODULE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Wen Liu, Beijing (CN); Xu Lu, Beijing (CN); An Fu, Beijing (CN); Qing Gong, Beijing (CN); Zhixin Cui, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/028,787

(22) PCT Filed: Jun. 29, 2022

(86) PCT No.: PCT/CN2022/102100
§ 371 (c)(1),
(2) Date: Mar. 28, 2023

(87) PCT Pub. No.: WO2024/000209
PCT Pub. Date: Jan. 4, 2024

(65) Prior Publication Data
US 2025/0081344 A1    Mar. 6, 2025

(51) Int. Cl.
*H05K 1/02* (2006.01)
*G09F 9/30* (2006.01)
(Continued)

(52) U.S. Cl.
CPC ............. *H05K 1/118* (2013.01); *H01Q 1/243* (2013.01); *H01Q 1/38* (2013.01); *H04B 5/43* (2024.01); *H05K 1/0268* (2013.01); *H05K 1/189* (2013.01)

(58) Field of Classification Search
CPC ........ H05K 1/02; H05K 1/0268; H05K 1/118; H05K 1/189; H04B 5/43; H01L 25/0753;
(Continued)

(56) References Cited

U.S. PATENT DOCUMENTS

2012/0262886 A1* 10/2012 Yamagishi ........... H05K 1/0268
361/749
2014/0328084 A1* 11/2014 Chuang .................. H01Q 1/243
361/767
(Continued)

FOREIGN PATENT DOCUMENTS

CN     203134973 U     8/2013
CN     104360502 A     2/2015
(Continued)

*Primary Examiner* — Xiaoliang Chen
(74) *Attorney, Agent, or Firm* — HOUTTEMAN LAW LLC (57) ABSTRACT

The disclosure provides a display module, including a display substrate and a FPC board; the display substrate includes a first base substrate, first bonding terminals, first impedance-test bonding terminals, and an antenna radiation structure; the FPC board includes a second base substrate, second bonding terminals, second impedance-test bonding terminals, and an antenna receiving structure; the first bonding terminals are bonded and connected to the second bonding terminals; the first impedance-test bonding terminals are bonded and connected to the second impedance-test bonding terminals; the antenna radiation structure has two ends respectively connected to two first impedance-test bonding terminals; the antenna receiving structure has two ends respectively connected to two second impedance-test bonding terminals; and the two first impedance-test bonding terminals connected to the antenna radiation structure are respectively bonded and connected to the two second impedance-test bonding terminals connected to the antenna receiving structure in one-to-one correspondence.

18 Claims, 6 Drawing Sheets

(51) Int. Cl.
*G09F 9/33* (2006.01)
*H01Q 1/22* (2006.01)
*H01Q 1/24* (2006.01)
*H01Q 1/38* (2006.01)
*H04B 5/43* (2024.01)
*H05K 1/11* (2006.01)
*H05K 1/18* (2006.01)
*H10H 20/857* (2025.01)

(58) Field of Classification Search
CPC ............ H01Q 1/22; H01Q 1/38; H01Q 1/243; H10H 20/857; H10H 20/8312; G09F 9/30; G09F 9/33; G09F 9/3026; G09G 3/006
USPC ....... 361/749, 748, 760, 784; 362/97.1, 623; 257/79; 345/204
See application file for complete search history.

(56) References Cited

U.S. PATENT DOCUMENTS

| | | | |
|---|---|---|---|
| 2018/0218194 A1* | 8/2018 | Lee | H04W 88/02 |
| 2019/0348478 A1* | 11/2019 | Kim | G09G 3/006 |
| 2024/0045292 A1* | 2/2024 | Feng | G02F 1/136295 |
| 2024/0047851 A1* | 2/2024 | Feng | H01Q 1/243 |
| 2024/0295936 A1* | 9/2024 | Xu | H10D 86/60 |

FOREIGN PATENT DOCUMENTS

| | | |
|---|---|---|
| CN | 107683020 A | 2/2018 |
| CN | 112863350 A | 5/2021 |
| CN | 113380865 A | 9/2021 |
| CN | 114171561 A | 3/2022 |
| JP | 2006276115 A | 10/2006 |

* cited by examiner

DISPLAY MODULE AND DISPLAY DEVICE

CROSS REFERENCE TO RELATED APPLICATION

This is a National Phase Application filed under 35 U.S.C. 371 as a national stage of PCT/CN2022/102100, filed on Jun. 29, 2022, the contents of which are incorporated herein by reference in their entirety.

TECHNICAL FIELD

Embodiments of the present disclosure belong to the field of display technology, and particularly relates to a display module and a display device.

BACKGROUND

Many antennas such as an operator antenna, a wifi antenna, a bluetooth antenna, and a GPS antenna are disposed inside a mobile phone product. A steel patch antenna attached to the back of a mobile phone is generally adopted in the related art. Due to limited space of the product and defects of the steel patch antenna concerning size, thickness, high assembling design difficulty, and high simulation difficulty thereof, all mainstream antennas adopt the LDS antenna technology at present. The LDS antenna technology refers to the Laser-Direct-Structuring technology, in which a computer is used to control movement of laser beams according to a trace of a conductive pattern, the laser beams are projected onto a molded three-dimensional plastic device, and a circuit pattern is activated within a few seconds. In brief (as for design and production of the antennas of the mobile phones), a metal antenna pattern is directly formed on a molded plastic frame by chemical plating using the laser technology. With the LDS antenna technology, antennas can be directly formed on shells of the mobile phones.

SUMMARY

In a first aspect, the embodiments of the present disclosure provide a display module having a display region and a bonding region, and the bonding region is at a side of the display region and adjoins the display region;
the display module includes a display substrate and a flexible printed circuit board; the display substrate includes a first base substrate, a plurality of first bonding terminals,
a plurality of first impedance-test bonding terminals, and at least one antenna radiation structure;
the plurality of first bonding terminals, the plurality of first impedance-test bonding terminals, and the at least one antenna radiation structure are on the first base substrate and within the bonding region;
the plurality of first impedance-test bonding terminals are on at least one end of a straight line formed by arrangement of the plurality of first bonding terminals;
the flexible printed circuit board includes a second base substrate, a plurality of second bonding terminals, a plurality of second impedance-test bonding terminals, and at least one antenna receiving structure;
the plurality of second bonding terminals, the plurality of second impedance-test bonding terminals, and the at least one antenna receiving structure are on the second base substrate and within the bonding region;
the plurality of second impedance-test bonding terminals are on at least one end of a straight line formed by arrangement of the plurality of second bonding terminals;
the plurality of first bonding terminals are bonded and connected to the plurality of second bonding terminals;
the plurality of first impedance-test bonding terminals are bonded and connected to the plurality of second impedance-test bonding terminals;
the antenna radiation structure has one end connected to one first impedance-test bonding terminal and the other end connected to another first impedance-test bonding terminal;
the antenna receiving structure has one end connected to one second impedance-test bonding terminal and the other end connected to another second impedance-test bonding terminal; and
the two first impedance-test bonding terminals connected to the antenna radiation structure are respectively bonded and connected to the two second impedance-test bonding terminals connected to the antenna receiving structure in one-to-one correspondence.

In some embodiments, the antenna radiation structure is on a side of the plurality of first bonding terminals close to the first impedance-test bonding terminals;
the antenna radiation structure includes a spiral wire, a first connection line, and a second connection line;
one end of the spiral wire is connected to the first connection line, and the first connection line is connected to one first impedance-test bonding terminal; and
the other end of the spiral wire is connected to the second connection line, and the second connection line is connected to another first impedance-test bonding terminal.

In some embodiments, the first connection line and the second connection line are on a same insulating film layer on the first base substrate; and
the spiral wire and the first connection line are on different insulating film layers on the first base substrate.

In some embodiments, the spiral wire and the plurality of first impedance-test bonding terminals are on a same insulating film layer on the first base substrate; or
the spiral wire and the plurality of first impedance-test bonding terminals are on different insulating film layers on the first base substrate.

In some embodiments, the plurality of first bonding terminals and the plurality of first impedance-test bonding terminals are in a surface layer of the display substrate on a display side.

In some embodiments, the antenna receiving structure is on a side of the plurality of second bonding terminals close to the second impedance-test bonding terminals;
the antenna receiving structure includes a third connection line, a fourth connection line, a first connection terminal, and a second connection terminal;
the third connection line has one end connected to one second impedance-test bonding terminal and the other end connected to the first connection terminal; and
the fourth connection line has one end connected to another second impedance-test bonding terminal and the other end connected to the second connection terminal.

In some embodiments, the third connection line and the fourth connection line are on a same insulating film layer on the second base substrate;

the first connection terminal and the second connection terminal are on a same insulating film layer on the second base substrate; and the third connection line and the first connection terminal are on different insulating film layers on the second base substrate.

In some embodiments, the first connection terminal and the second connection terminal are in a surface layer of the flexible printed circuit board on a first side;

the plurality of second bonding terminals and the plurality of second impedance-test bonding terminals are in a surface layer of the flexible printed circuit board on a second side; and the first side and the second side of the flexible printed circuit board are opposite to each other.

In some embodiments, the display module further includes a heat dissipation layer on a back side of the display substrate away from a display side of the display substrate;

the heat dissipation layer includes a nonmetal sublayer and a metal sublayer stacked in a direction departing from the display substrate;

the bonding region of the display substrate is bent to the back side of the display substrate and on a side of the heat dissipation layer away from the display substrate;

an orthographic projection of the antenna radiation structure on the first base substrate falls within the heat dissipation layer; and the orthographic projection of the antenna radiation structure on the first base substrate overlaps the nonmetal sublayer, but does not overlap the metal sublayer.

In some embodiments, the heat dissipation layer further includes an insulating adhesive layer on a side of the nonmetal sublayer away from the display substrate:

the orthographic projection of the antenna radiation structure on the first base substrate is coincident with the insulating adhesive layer; and a surface of the insulating adhesive layer away from the nonmetal sublayer is flush with a surface of the metal sublayer away from the nonmetal sublayer.

In some embodiments, the display module further includes an attaching layer between the bonding region of the display substrate bent to the back side of the display substrate and the heat dissipation layer, so as to attach the bonding region of the display substrate bent to the back side of the display substrate and the heat dissipation layer together;

a region of the attaching layer corresponding to the antenna radiation structure is provided with an opening; and the opening penetrates through the attaching layer in a thickness direction of the attaching layer.

In some embodiments, the flexible printed circuit board is on the side of the heat dissipation layer away from the display substrate, and an orthographic projection of the flexible printed circuit board on the display substrate overlaps the heat dissipation layer; and the first connection terminal and the second connection terminal are on a surface of the flexible printed circuit board away from the display substrate.

In some embodiments, the display module further includes an antenna radiation signal source on a side of the flexible printed circuit board away from the display substrate;

the antenna radiation signal source includes a signal output terminal and a signal feed-in terminal; and the signal output terminal is connected to the first connection terminal, and the signal feed-in terminal is connected to the second connection terminal.

In some embodiments, each of the first connection terminal and the second connection terminal is a spring loaded connection terminal; and each of the signal output terminal and the signal feed-in terminal is a spring loaded connection terminal.

In a second aspect, the embodiments of the present disclosure provide a display device, including the display module described above.

BRIEF DESCRIPTION OF DRAWINGS

The drawings are intended to provide a further understanding of the embodiments of the present disclosure, and constitute a part of the specification. Together with the embodiments of the present disclosure, the drawings are used to explain the present disclosure, but do not constitute any limitation to the present disclosure. The above and other features and advantages can be apparent to those of ordinary skill in the art from the description of specific exemplary embodiments with reference to the drawings. In the drawings.

DETAIL DESCRIPTION OF EMBODIMENTS

In order to enable those of ordinary skill in the art to better understand the technical solutions of the embodiments of the present disclosure, a display module and a display device provided by the embodiments of the present disclosure are further described in detail below with reference to the drawings and specific embodiments.

The embodiments of the present disclosure will be described more fully below with reference to the drawings, but the embodiments illustrated herein may be embodied in different forms and should not be interpreted as being limited to the embodiments described herein. Rather, the embodiments are provided to make the present disclosure thorough and complete, and are intended to enable those of ordinary skill in the art to fully understand the scope of the present disclosure.

The embodiments of the present disclosure are not limited to those illustrated by the drawings, but include modifications to configuration formed based on a manufacturing process. Thus, regions shown in the drawings are illustrative, and shapes of the regions shown in the drawings illustrate specific shapes of the regions, but are not intended to make limitations.

NFC is a near field communication technique for non-contact radio frequency identification, generally involves a communication distance of about 10 cm, an operating frequency of 13.5 MHZ, and a maximum transmission rate of 424 Kbit, and can allow for near field communication between mobile devices, consumer electronics, personal computers (PCs), and smart control tools. The NFC provides a simple touch-control solution which can allow consumers to exchange information and have access to contents and services in a simple and intuitive way.

The NFC is implemented by an NFC module and an NFC antenna. The NFC module generally includes a high-speed single-chip microcomputer, a radio frequency chip, and a matching circuit. The NFC module provides a radiation signal source for the NFC antenna, for example, the NFC module supplies a variable current to the NFC antenna.

Figure 1:
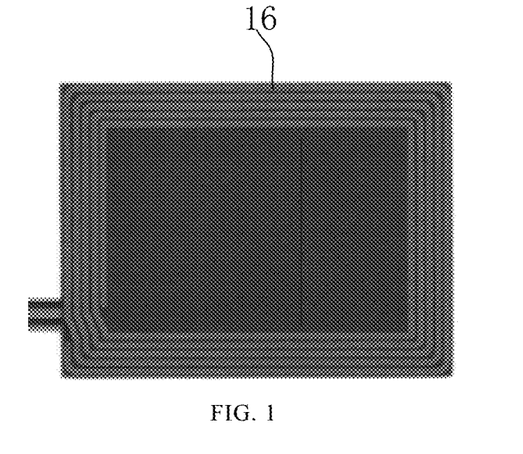
FIG. 1 is a top view of a structure of a Near Field Communication (NFC) antenna.

In the related art, with reference to FIG. 1, which is a top view of a structure of an NFC antenna. An NFC antenna 16 is generally designed in the form of a closed coil, and may be regarded as a coupling coil. According to Ampere's law, when a current flows through a segment of a conductor, a magnetic field is generated around the conductor, and an induction strength of the magnetic field is proportional to the number of turns of a coil and an area of the coil, and is attenuated with the third power of a distance. The NFC antenna 16 forms inductance through a change of a current in the closed coil to radiate a signal outward.

In the related art, an NFC antenna of a mobile phone is usually connected to an NFC module through an ipex interface, and is then connected through an antenna transmission line and attached to a back of a shell of the mobile phone, which has a certain influence on a thickness of the mobile phone.

Figure 2:
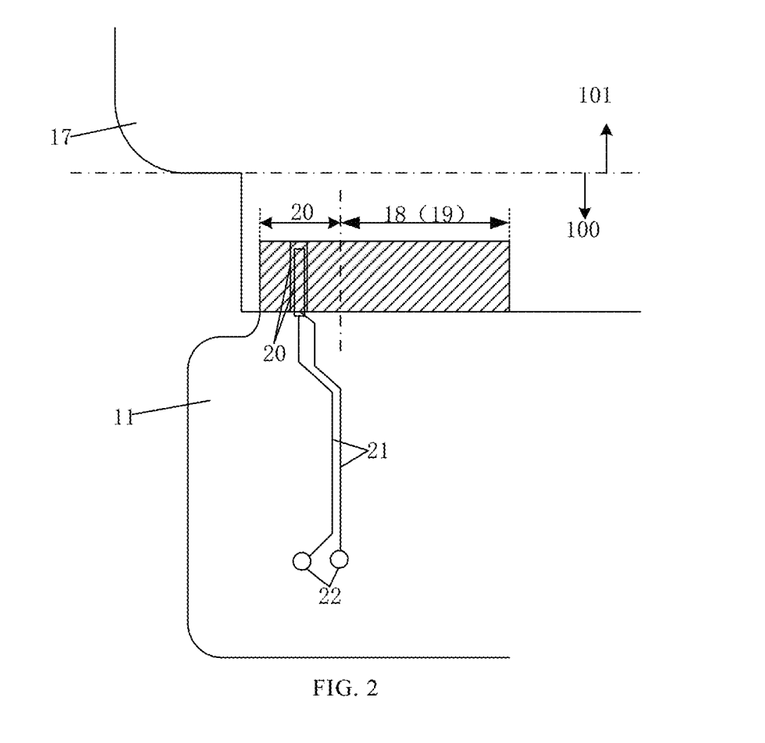
FIG. 2 is a schematic diagram of wiring when bonding connection impedance between a display panel and a flexible printed circuit board is tested after the display panel is bonded and connected to the flexible printed circuit board.

In the related art, with reference to FIG. 2, which is a schematic diagram illustrating wiring when bonding connection impedance between a display panel and a flexible printed circuit board is tested after the display panel is bonded and connected to the flexible printed circuit board. A display panel 17 is bonded and connected to a flexible printed circuit board 11 to achieve circuit connection with an equipment motherboard (e.g., a main control board, not shown). The display panel 17 includes a bonding region 100 located on a side of a display region 101 and adjoining the display region 101; and a signal bonding terminal 18 is disposed in the bonding region 100, and is bonded and connected to a bonding terminal 19 on the flexible printed circuit board 11, so as to achieve connection between a circuit in the display panel 17 and a circuit on the equipment motherboard. The signal bonding terminal 18 in the bonding region 100 is generally arranged in a linear way: in order to test stability of the bonding connection between the display panel 17 and the flexible printed circuit board 11, bonding impedance between the signal bonding terminal 18 in the bonding region 100 of the display panel 17 and the bonding terminal 19 on the flexible printed circuit board 11 needs to be tested. In practical design, an impedance-test bonding terminal 20 is generally disposed at an end of an area where the signal bonding terminal 18 is arranged in the bonding region 100 of the display panel 17, and correspondingly, another impedance-test bonding terminal 20 is arranged at an end of an area where the bonding terminal 19 is arranged on the flexible printed circuit board 11; and in a bonding process, the signal bonding terminal 18 in the bonding region 100 of the display panel 17 is correspondingly bonded and connected to the bonding terminal 19 on the flexible printed circuit board 11, and meanwhile, the impedance-test bonding terminal 20 in the bonding region 100 of the display panel 17 is correspondingly bonded and connected to the impedance-test bonding terminal 20 on the flexible printed circuit board 11. Two leads 21 are led out from one or more (typically four) bonded and connected impedance-test bonding terminals 20 on the flexible printed circuit board 11, and are respectively connected to two test points 22, and bonding impedance between the impedance-test bonding terminals 20 can be measured by bringing two test leads of a multimeter into contact with the two test points 22.

The test of the bonding impedance between the display panel 17 and the flexible printed circuit board 11 is performed in a trial-production stage of products, a control range of the bonding impedance is set according to measured values of the bonding impedance in the trial-production stage of the products, and the bonding impedance is regarded to be qualified as long as a measured value of the bonding impedance falls within the control range. The test of the bonding impedance is performed in the trial-production stage of each batch of the products; and after the test of the bonding impedance is completed, the impedance-test bonding terminals 20 on the display panel 17 and the flexible printed circuit board 11 and a test circuit (including the leads 21 and the test points 22) formed thereby are kept in the product, without being used any more.

Figures 3, 4:
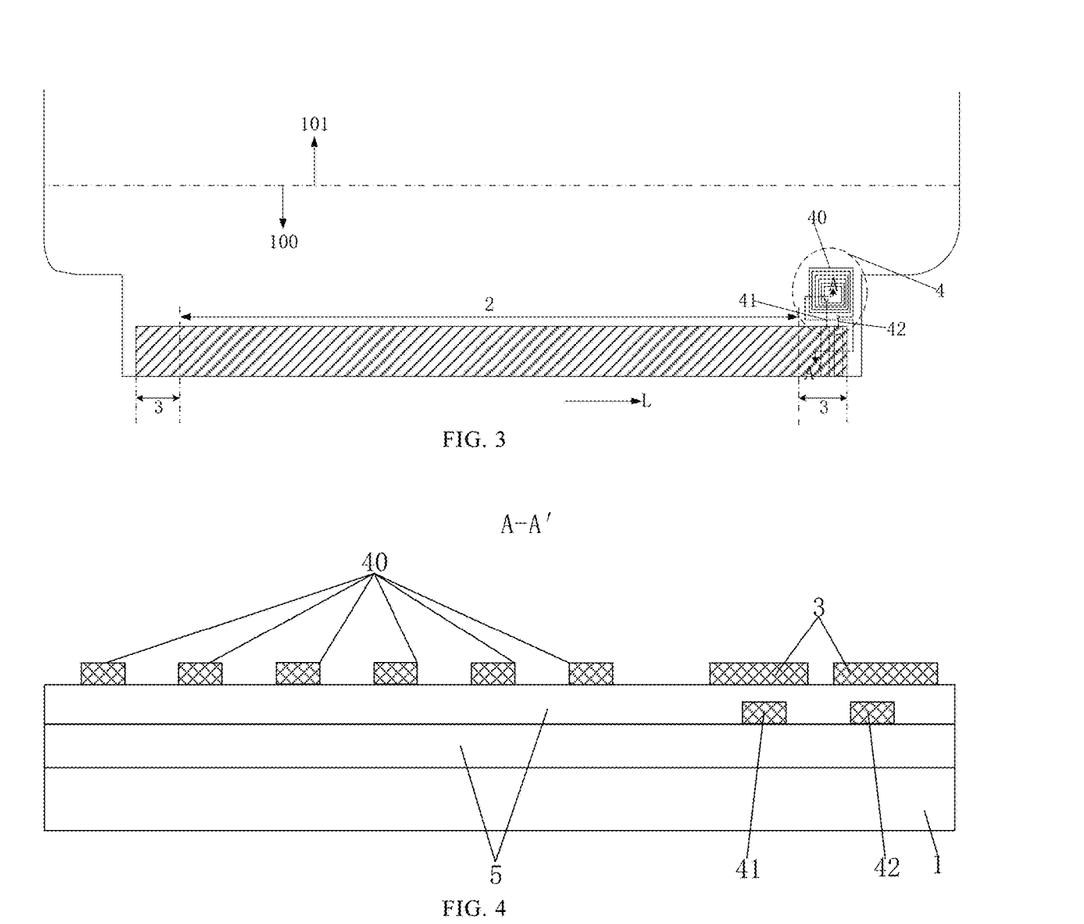
FIG. 3 is a top view of a partial structure of a display substrate according to the embodiments of the present disclosure.
FIG. 4 is a cross-sectional view taken along a section line AA' in FIG. 3.
Figure 5:
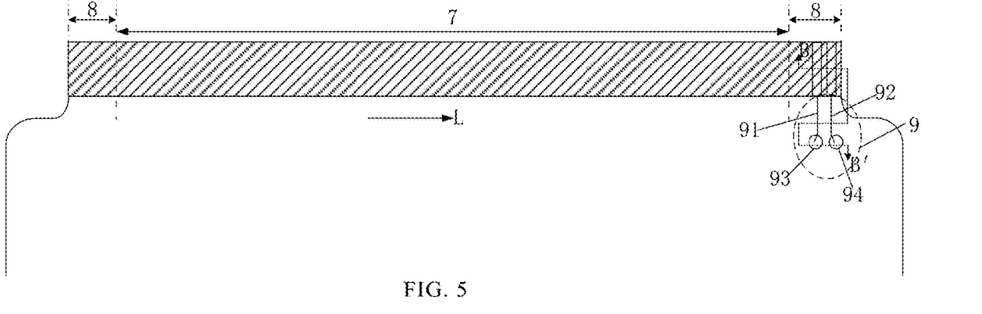
FIG. 5 is a top view of a partial structure of a flexible printed circuit board according to the embodiments of the present disclosure.
Figure 6:
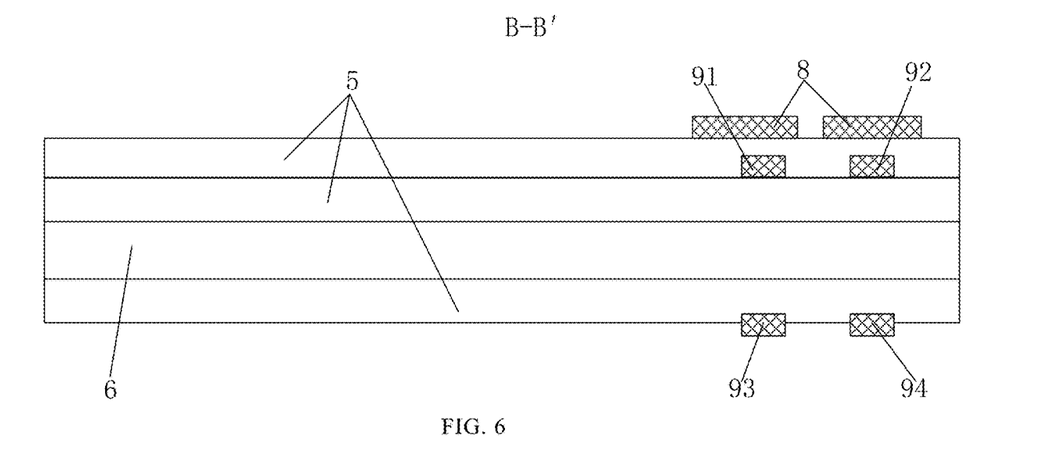
FIG. 6 is a cross-sectional view taken along a section line BB' in FIG. 5.

In order to solve the problem that attaching the NFC antenna of the mobile phone to the back of the shell of the mobile phone has the certain influence on the thickness of the mobile phone, in a first aspect, the embodiments of the present disclosure provide a display module. With reference to FIGS. 3 to 6, FIG. 3 is a top view of a partial structure of a display substrate according to the embodiments of the present disclosure, FIG. 4 is a cross-sectional view taken along a section line AA' in FIG. 3, FIG. 5 is a top view of a partial structure of a flexible printed circuit board according to the embodiments of the present disclosure, and FIG. 6 is a cross-sectional view taken along a section line BB' in FIG. 5. The display module has a display region 101, and a bonding region 100 located on a side of the display region 101 and adjoining the display region 101. The display module includes a display substrate 10 and a flexible printed circuit board 11. The display substrate 10 includes a first base substrate 1, a plurality of first bonding terminals 2, a plurality of first impedance-test bonding terminals 3, and at least one antenna radiation structure 4; the plurality of first bonding terminals 2, the plurality of first impedance-test bonding terminals 3, and the at least one antenna radiation structure 4 are located on the first base substrate 1 and within the bonding region 100. The plurality of first impedance-test bonding terminals 3 are located at at least one end of a straight line formed by arrangement of the plurality of first bonding terminals 2. The flexible printed circuit board 11 includes a second base substrate 6, a plurality of second bonding terminals 7, a plurality of second impedance-test bonding terminals 8, and at least one antenna receiving structure 9; the plurality of second bonding terminals 7, the plurality of second impedance-test bonding terminals 8, and the at least one antenna receiving structure 9) are located on the second base substrate 6 and within the bonding region 100. The plurality of second impedance-test bonding terminals 8 are located at at least one end of a straight line formed by arrangement of the plurality of second bonding terminals 7. The first bonding terminals 2 are bonded and connected to the second bonding terminals 7; the first impedance-test bonding terminals 3 are bonded and connected to the second impedance-test bonding terminals 8. The antenna radiation structure 4 has one end connected to one first impedance-test bonding terminal 3 and the other end connected to another first impedance-test bonding terminal 3. The antenna receiving structure 9 has one end connected to one second impedance-test bonding terminal 8 and the other end connected to another second impedance-test bonding terminal 8. The two first impedance-test bonding terminals 3 connected to the antenna radiation structure 4 are respectively bonded and connected to the two second impedance-test bonding terminals 8 connected to the antenna receiving structure 9 in one-to-one correspondence.

In some embodiments, the plurality of first bonding terminals 2 are arranged in sequence along a linear direction L; the plurality of second bonding terminals 7 are arranged in sequence along the linear direction L; and the plurality of second bonding terminals 7 are respectively bonded and connected to the plurality of first bonding terminals 2 in one-to-one correspondence, so that the display substrate 10 can be connected to an equipment motherboard through the flexible printed circuit board 11, thereby allowing the equipment motherboard to provide a driving signal or a control signal to the display substrate 10. The plurality of second impedance-test bonding terminals 8 are respectively bonded and connected to the plurality of first impedance-test bonding terminals 3 in one-to-one correspondence. The first impedance-test bonding terminals 3 are bonded and connected to the second impedance-test bonding terminals 8, so as to allow for a test of bonding connection impedance between the display substrate 10 and the flexible printed circuit board 11.

In the display module provided by the embodiments, the two first impedance-test bonding terminals 3 connected to the antenna radiation structure 4 are respectively bonded and connected to the two second impedance-test bonding terminals 8 connected to the antenna receiving structure 9 in one-to-one correspondence, so that the antenna radiation structure 4 and the antenna receiving structure 9 can form an NFC antenna through the first impendence-test bonding terminals 3 and the second impendence-test bonding terminals 8 which are bonded and connected, that is, the bonding impedance test circuit originally formed in the display module in the related art is also used as the NFC antenna in the embodiments, which obviates the need to attach the NFC antenna to a back of a case of the display module, so that a thickness of the display module is not increased, and the ultra-thin display module can be realized.

In some embodiments, the antenna radiation structure 4 is located on a side of the first bonding terminals 2 close to the first impedance-test bonding terminals 3. The antenna radiation structure 4 includes a spiral wire 40, a first connection line 41, and a second connection line 42. One end of the spiral wire 40 is connected to the first connection line 41, and the first connection line 41 is connected to one first impedance-test bonding terminal 3; and the other end of the spiral wire 40 is connected to the second connection line 42, and the second connection line 42 is connected to another first impedance-test bonding terminal 3.

In the embodiments, based on the first impedance-test bonding terminals 3 originally disposed on the display substrate in the related art, a spiral wire 40, which can serve as the coil of the NFC antenna, is formed near the first impedance-test bonding terminals 3 in the bonding region 100. After the first impedance-test bonding terminals 3 are bonded and connected to the second impedance-test bonding terminals 8 on the flexible printed circuit board, the bonding impedance test circuit originally formed in the display module in the related art can also be used as the NFC antenna, which obviates the need to attach the NFC antenna to the back of the case of the display module, so that the thickness of the display module is not increased, and the ultra-thin display module can be realized.

In some embodiments, the plurality of first impedance-test bonding terminals 3 are located at two ends of the straight line formed by the arrangement of the plurality of first bonding terminals 2.

In some embodiments, one antenna radiation structure 4 may be provided, located at one end of the straight line formed by the arrangement of the plurality of first bonding terminals 2, and connected to the first impedance-test bonding terminal 3 located at the one end of the straight line formed by the arrangement of the plurality of first bonding terminals 2.

In some embodiments, two antenna radiation structures 4 may be provided, respectively located at two ends of the straight line formed by the arrangement of the plurality of first bonding terminals 2, and respectively connected to the first impedance-test bonding terminals 3 located at two ends of the straight line formed by the arrangement of the plurality of first bonding terminals 2. In some embodiments, more than three antenna radiation structures 4 may be provided. Areas where the two ends of the straight line formed by the arrangement of the plurality of first bonding terminals 2 are located are free of interference from other wires, so that normal signal radiation of the antenna radiation structure 4 can be ensured.

In some embodiments, with reference to FIG. 4, the first connection line 41 and the second connection line 42 are located on a same insulating film layer 5 on the first base substrate 1; and the spiral wire 40 and the first connection line 41 are located on different insulating film layers 5 on the first base substrate 1.

Connection between the spiral wire 40 and each of the first connection line 41 and the second connection line 42 may be achieved by forming a via hole in the insulating film layer 5.

In some embodiments, with reference to FIG. 4, the spiral wire 40 and the first impedance-test bonding terminals 3 are located on a same insulating film layer 5 on the first base substrate 1.

In some embodiments, the spiral wire and the first impedance-test bonding terminals are located on different insulating film layers on the first base substrate (not shown).

In some embodiments, the spiral wire 40 may be formed using the LDS (Laser-Direct-structuring) technology, or by a printing or etching process.

In some embodiments, with reference to FIG. 3, the first bonding terminals 2 and the first impedance-test bonding terminals 3 are located in a surface layer of the display substrate 10 on a display side. Thus, the first bonding terminals 2 and the first impedance-test bonding terminals 3 may be conveniently bonded and connected to the flexible printed circuit board 11.

In some embodiments, pixel driving circuits and a light-emitting units are disposed in the display region 101, and the pixel driving circuits drive the light-emitting units to perform display; and for example, the light-emitting units are organic light-emitting diode elements (i.e., OLED elements). Wires of circuits in the display region 101 are extended to the bonding region 100 and are respectively and correspondingly connected to the plurality of first bonding terminals 2 in the bonding region 100, so as to be connected to the equipment motherboard through the bonding connection between the first bonding terminals 2 and the bonding terminals on the flexible printed circuit board. The equipment motherboard is configured to provide driving signals or control signals for the display of the light-emitting units in the display region 101.

In some embodiments, the spiral wire 40 is designed by simulation to radiate a signal towards the display side of the display substrate. Since most of the other antennas (such as a wifi antenna, a bluetooth antenna and an operator antenna) in a display product designed to be located on a back side away from a display side of a display substrate, the above arrangement can reduce signal interference between the NFC antenna and the other antennas, and ensure radiation signal intensity of the NFC antenna.

In some embodiments, the first base substrate 1 may be made of a flexible material such as polyimide. The insulating film layers 5 in the display substrate may also contain a flexible material, so that the display substrate may be flexibly bent, thereby allowing for flexible display of the display substrate or the display product.

In some embodiments, with reference to FIG. 5 and FIG. 6, the antenna receiving structure 9 is located on a side of the second bonding terminals 7 close to the second impedance-test bonding terminals 8. The antenna receiving structure 9 includes a third connection line 91, a fourth connection line 92, a first connection terminal 93, and a second connection terminal 94. The third connection line 91 has one end connected to one second impedance-test bonding terminal 8 and the other end connected to the first connection terminal 93. The fourth connection line 92 has one end connected to another second impedance-test bonding terminal 8 and the other end connected to the second connection terminal 94.

The antenna receiving structure 9 is equivalent to the bonding impedance test circuit originally disposed on the flexible printed circuit board in the related art. In the embodiments, the bonding impedance test circuit originally disposed on the flexible printed circuit board can also be used as the antenna receiving structure 9. After the second impedance-test bonding terminals 8 are bonded and connected to the first impedance-test bonding terminals 3, circuit connection between the antenna receiving structure 9 and the antenna radiation structure 4 is realized, and the entire connected circuit can be used as the NFC antenna. The first connection terminal 93 and the second connection terminal 94 may be connected to an NFC module disposed in the display module, so that the NFC module can provide a variable current signal to the NFC antenna, and the spiral wire in the NFC antenna can form inductance when a variable current passes therethrough, thereby radiating a signal outward.

In the embodiments of the present application, by using the bonding impedance test circuit originally disposed on the flexible printed circuit board as the antenna receiving structure 9, the need to attach the NFC antenna to the back of the case of the display module is obviated, so that the thickness of the display module is not increased, and the ultra-thin display module can be realized.

In some embodiments, with reference to FIG. 6, the third connection line 91 and the fourth connection line 92 are located on a same insulating film layer 5 on the second base substrate 6. The first connection terminal 93 and the second connection terminal 94 are located on a same insulating film layer 5 on the second base substrate 6, and the third connection line 91 and the first connection terminal 93 are located on different insulating film layers 5 on the second base substrate 6.

In some embodiments, the third connection line 91 is connected to the first connection terminal 93 through a via hole formed in the insulating film layers 5; and the fourth connection line 92 is connected to the second connection terminal 94 through a via hole formed in the insulating film layers 5.

In some embodiments, the third connection line 91 and the fourth connection line 92 are located on a same insulating film layer 5 on the second base substrate 6; and the third connection line 91 and the second impedance-test bonding terminals 8 are located on different insulating film layers 5 on the second base substrate 6.

In some embodiments, the third connection line 91 and the fourth connection line 92 may be respectively connected to the second impedance-test bonding terminals 8 through via holes formed in the insulating film layer 5.

In some embodiments, the first connection terminal 93 and the second connection terminal 94 are located in a surface layer of the flexible printed circuit board 11 on a first side; the second bonding terminals 7 and the second impedance-test bonding terminals 8 are located in a surface layer of the flexible printed circuit board 11 on a second side; and the first side and the second side of the flexible printed circuit board 11 are opposite to each other. Such arrangement facilitates subsequent bonding connection between the second bonding terminals 7 and the first bonding terminals 2 on the display substrate 10, and subsequent bonding connection between the second impedance-test bonding terminals 8 and the first impedance-test bonding terminals 3, and also facilitates exposing the first connection terminal 93 and the second connection terminal 94 at a surface of the flexible printed circuit board 11, so as to allow the first connection terminal 93 and the second connection terminal 94 to be conveniently connected to the NFC module.

In some embodiments, each of the first connection terminal 93 and the second connection terminal 94 is a spring loaded connection terminal. By adopting the spring loaded connection terminals, the first connection terminal 93 and the second connection terminal 94 can be connected to the NFC module without using an ipex interface. Meanwhile, with the spring loaded connection terminals, a length of an antenna transmission line between the NFC antenna and the NFC module can be reduced, so that a cost of the NFC antenna can be reduced, and signal interference of the internal circuits of the display module to the NFC antenna can be weakened.

Figure 7:
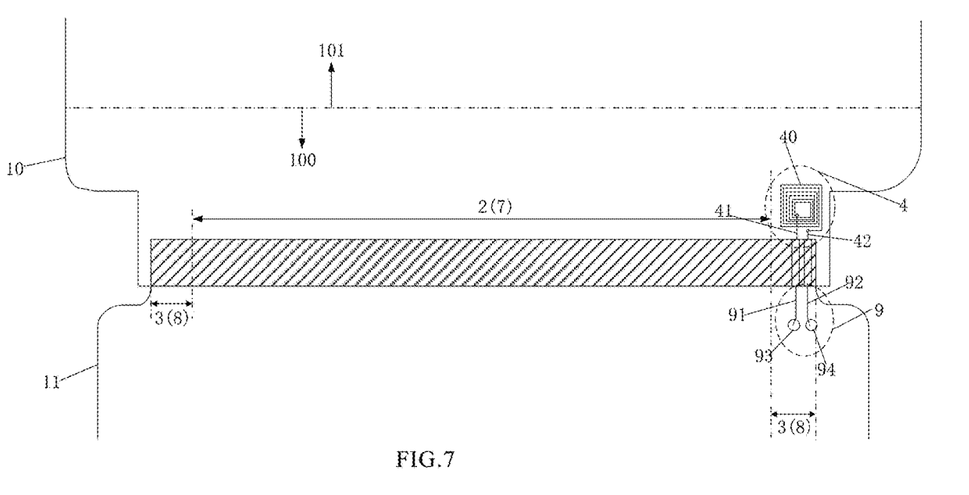
FIG. 7 is a top view of a partial structure of a display module after a display substrate is bonded and connected to a flexible printed circuit board and before a bonding region is bent according to the embodiments of the present disclosure.
Figure 8:
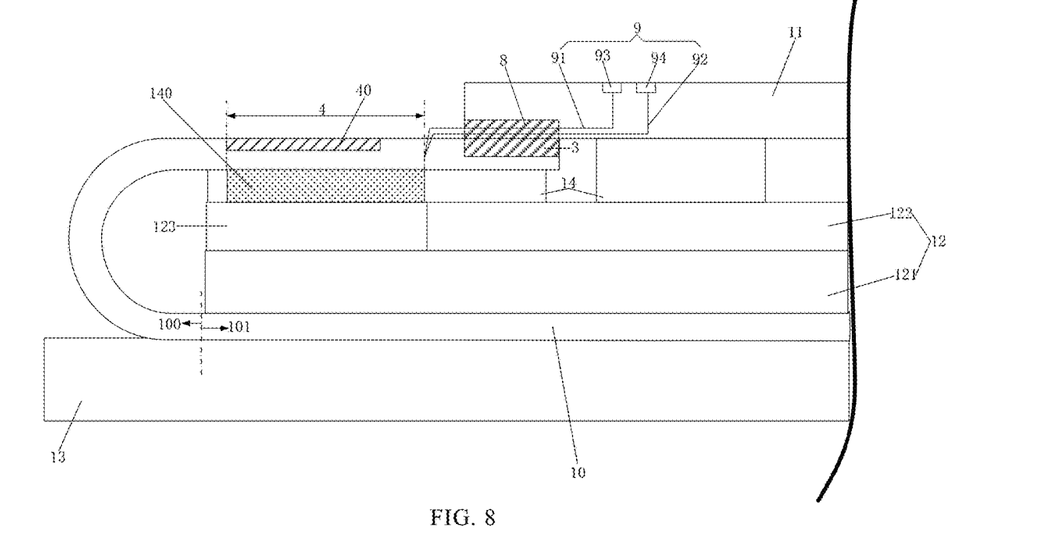
FIG. 8 is a side view of a partial structure of the display module after the display substrate is bonded and connected to the flexible printed circuit board and the bonding region is bent to a back side of the display substrate according to the embodiments of the present disclosure.

In some embodiments, with reference to FIGS. 7 and 8, FIG. 7 is a top view of a partial structure of the display module after the display substrate is bonded and connected to the flexible printed circuit board and before the bonding region is bent according to the embodiments of the present disclosure, and FIG. 8 is a side view of a partial structure of the display module after the display substrate is bonded and connected to the flexible printed circuit board and the bonding region is bent to a back side of the display substrate according to the embodiments of the present disclosure. The display module further includes a heat dissipation layer 12 disposed on the back side of the display substrate 10 away from the display side thereof: the heat dissipation layer 12 includes a nonmetal sublayer 121 and a metal sublayer 122, which are stacked in a direction departing from the display substrate 10. The bonding region 100 of the display substrate 10 is bent to the back side of the display substrate 10 and located on a side of the heat dissipation layer 12 away from the display substrate 10: an orthographic projection of the antenna radiation structure 4 of the display substrate 10 on the first base substrate falls within the heat dissipation layer 12; and the orthographic projection of the antenna radiation structure 4 on the first base substrate overlaps the nonmetal sublayer 121, but does not overlap the metal sublayer 122.

In some embodiments, with reference to FIG. 8, a transparent cover plate 13 is further provided on the display side of the display substrate 10, and the antenna radiation structure 4 is designed by emulation to radiate the signal towards the transparent cover plate 13.

In some embodiments, the nonmetal sublayer 121 includes a foam layer, and an adhesive layer that is capable of attaching the heat dissipation layer 12 to the back side of the display substrate 10. The metal sublayer 122 is made of a metal material with good thermal conductivity, such as copper. With the orthographic projection of the antenna radiation structure 4 on the first base substrate not overlapping the metal sublayer 122, the metal sublayer 122 can be prevented from shielding the signal radiated by the antenna radiation structure 4, so as to ensure that the signal radiated by the antenna radiation structure 4 can be normally radiated towards the display side of the display substrate.

In some embodiments, a driver chip (e.g., a data driver chip, not shown) of the display module is at least partially located in a region of the back side of the display substrate 10 corresponding to the antenna radiation structure 4 in the bonding region 100, however, since the driver chip in this region is covered with the nonmetal sublayer 121 of the heat dissipation layer 12, the absence of the metal sublayer 122 in the region corresponding to the antenna radiation structure 4 does not affect heat dissipation of the driver chip.

In some embodiments, with reference to FIG. 8, the heat dissipation layer 12 further includes an insulating adhesive layer 123 located on a side of the nonmetal sublayer 121 away from the display substrate 10. The orthographic projection of the antenna radiation structure 4 on the first base substrate is coincident with the insulating adhesive layer 123; and a surface of the insulating adhesive layer 123 away from the nonmetal sublayer 121 is flush with a surface of the metal sublayer 122 away from the nonmetal sublayer 121. With the arrangement of the insulating adhesive layer 123, a level difference on a surface of the heat dissipation layer 12 away from the display substrate 10 can be avoided, so as to avoid an influence of the level difference on the signal radiated by the antenna radiation structure 4.

In some embodiments, with reference to FIG. 8, the display module further includes an attaching layer 14 located between the bonding region 100 of the display substrate 10 bent to the back side of the display substrate 10 and the heat dissipation layer 12, so as to attach the bonding region 100 of the display substrate 10 bent to the back side of the display substrate 10 and the heat dissipation layer 12 together. A region of the attaching layer 14 corresponding to the antenna radiation structure 4 is provided with an opening 140, which penetrates through the attaching layer 14 along a thickness direction of the attaching layer 14. Since the antenna radiation structure 4 needs a relatively open zone (i.e., a clearance zone) on a side thereof from which the signal is radiated, a cavity may be formed by forming the opening 140 in the region of the attaching layer 14 corresponding to the antenna radiation structure 4, so as to ensure that the antenna radiation structure 4 can radiate the signal with certain intensity towards the transparent cover plate 13.

In some embodiments, the attaching layer 14 may be made of a foam adhesive.

In some embodiments, with reference to FIG. 8, the flexible printed circuit board 11 is located on the side of the heat dissipation layer 12 away from the display substrate 10, and an orthographic projection of the flexible printed circuit board 11 on the display substrate 10 overlaps the heat dissipation layer 12. In the embodiments, the region of the flexible printed circuit board 11 other than the regions where the second bonding terminals and the second impedance-test bonding terminals 8 are located does not overlap the bonding region 100 of the display substrate 10 bent to the back side of the display substrate 10: such arrangement of the flexible printed circuit board 11 and such manner of bonding the flexible printed circuit board 11 to the display substrate 10 are referred to as a reverse bonding mode. In a case where the orthographic projection of the flexible printed circuit board 11 on the display substrate 10 is substantially coincident with the bonding region 100 of the display substrate 10 bent to the back side of the display substrate 10, such arrangement of the flexible printed circuit board 11 and such manner of bonding the flexible printed circuit board 11 to the display substrate 10 are referred to as a forward bonding mode. Compared with the forward bonding mode of the flexible printed circuit board 11, the reverse bonding mode of the flexible printed circuit board 11 can allow an area of an exposed part, which is out of a region covered by the flexible printed circuit board 11, of the bonding region 100 of the display substrate 10 bent to the back side of the display substrate 10 to be larger, thereby realizing larger radiation simulation space that can be used by the antenna radiation structure 4 in the bonding region 100.

In some embodiments, the first connection terminal 93 and the second connection terminal 94 of the flexible printed circuit board 11 are located on a surface of the flexible printed circuit board 11 away from the display substrate 10. Such arrangement facilitates connecting the first connection terminal 93 and the second connection terminal 94 to the NFC module.

Figure 9:
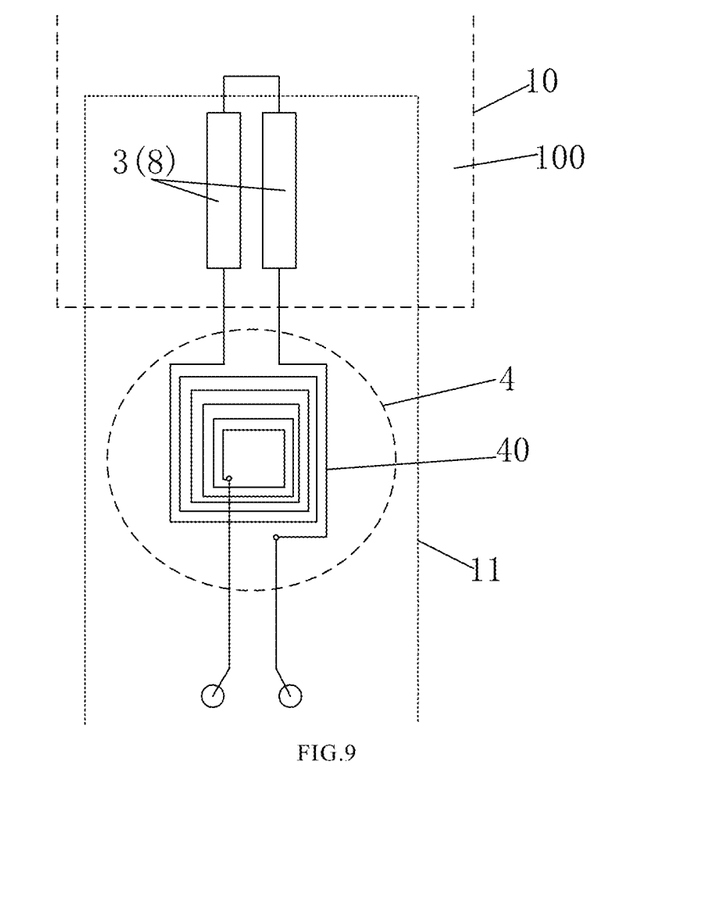
FIG. 9 is a top view of a structure in which an antenna radiation structure is disposed on a flexible printed circuit board according to the embodiments of the present disclosure.

FIG. 9 is a top view of a structure in which the antenna radiation structure is disposed on the flexible printed circuit board according to the embodiments of the present disclosure. In the embodiments, with reference to FIG. 7 and FIG. 8, the antenna radiation structure 4 is disposed in the bonding region 100 of the display substrate 10, which can save, compared with the solution of disposing the antenna radiation structure 4 on the flexible printed circuit board 11 illustrated by FIG. 9, a routing area of the circuit on the flexible printed circuit board 11, so that a volume and an area of the flexible printed circuit board 11 can be reduced, thereby reducing a cost of the flexible printed circuit board 11. A power supply battery of the display module is generally disposed in a region of the back side of the display substrate 10 out of the region where the flexible printed circuit board 11 is located, and an orthographic projection of the battery on the display substrate 10 falls within the heat dissipation layer 12. Thus, with both the volume and the area of the flexible printed circuit board 11 reduced, an area of a battery installation zone located on the back side of the display module 10 in the display module can be increased, so that the battery can be made bigger and supply power supply to the display module longer.

In addition, with reference to FIG. 7 to FIG. 9, compared to the solution of disposing the antenna radiation structure 4 on the flexible printed circuit board 11, in the solution provided by the embodiments, a protective film layer (typically an anti-electromagnetic interference film or an anti-electromagnetic radiation film) at a surface layer of the flexible printed circuit board 11 configured to protect wires of circuits in the flexible printed circuit board 11 may not be cut open, which allows for better protection performance of the protective film layer at the surface layer of the flexible printed circuit board 11.

Further, with reference to FIG. 7 to FIG. 9, for the solution of disposing the antenna radiation structure 4 on the flexible printed circuit board 11, inductance in a region of the spiral wire 40 close to the bonding terminals is not consistent with that in a region of the spiral wire 40 away from the bonding terminals due to an influence of the bonding terminals, resulting in relatively high simulation difficulty of the antenna radiation structure 4. However, in the solution of disposing the antenna radiation structure 4 in the bonding region 100 of the display substrate 10 provided by the embodiments, all regions of the spiral wire 40 have the same inductance, which can effectively reduce the simulation difficulty of the antenna radiation structure 4.

Further, with reference to FIG. 7 to FIG. 9, for the solution of disposing the antenna radiation structure 4 on the flexible printed circuit board 11, a longer wire is needed to connect the antenna radiation structure 4 to the NFC module, and the antenna radiation structure 4 may suffer from relatively large signal interference due to the longer wire. However, in the solution of disposing the antenna radiation structure 4 in the bonding region 100 of the display substrate 10 provided by the embodiments, the wire for connecting the antenna radiation structure 4 to the NFC module is shorter, so that the signal interference to the antenna radiation structure 4 is reduced, thereby ensuring the radiation signal intensity of the antenna radiation structure 4.

Figure 10:
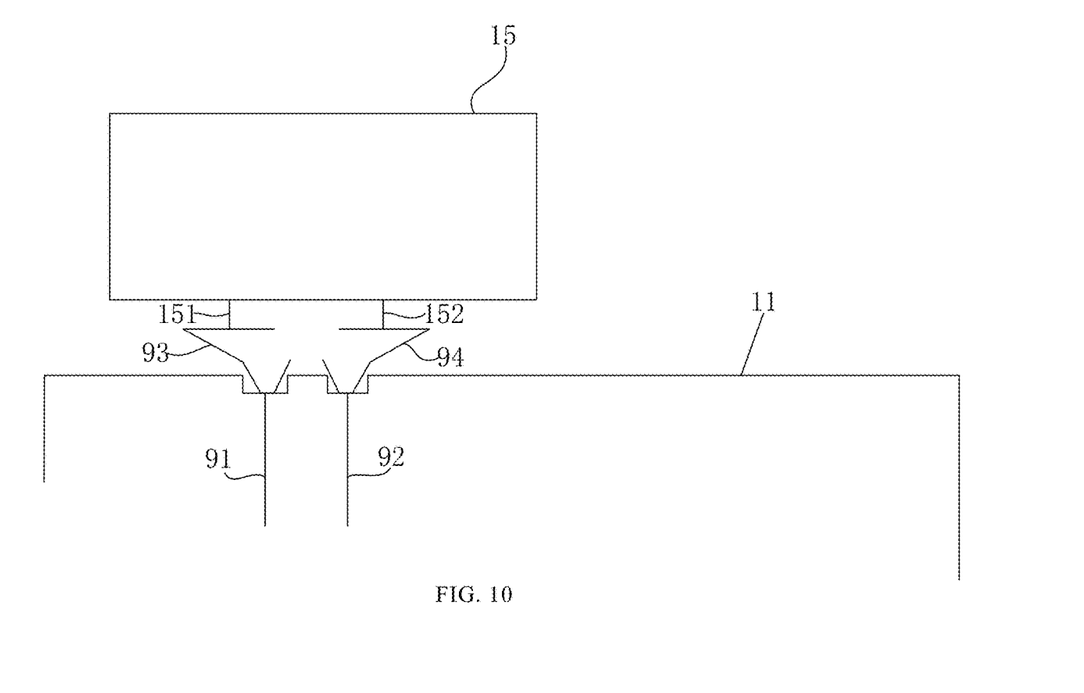
FIG. 10 is a schematic diagram of a connection structure between an antenna radiation signal source and an antenna receiving structure according to the embodiments of the present disclosure.

In some embodiments, with reference to FIG. 10, FIG. 10 is a schematic diagram of a connection structure between an antenna radiation signal source and an antenna receiving structure according to the embodiments of the present disclosure. The display module further includes an antenna radiation signal source 15 located on a side of the flexible printed circuit board 11 away from the display substrate 11. The antenna radiation signal source 15 includes a signal output terminal 151 and a signal feed-in terminal 152; and the signal output terminal 151 is connected to the first connection terminal 93, and the signal feed-in terminal 152 is connected to the second connection terminal 94.

The antenna radiation signal source 15 is the NFC module, which is generally composed of a high-speed single-chip microcomputer, a radio frequency chip, and a matching circuit. The NFC module provides the variable current signal to the NFC antenna formed by connecting the antenna radiation structure with the antenna receiving structure, and the spiral wire in the NFC antenna can form inductance when the variable current passes therethrough, so as to radiate the signal outward.

In some embodiments, with reference to FIG. 10, each of the signal output terminal 151 and the signal feed-in terminal 152 is a spring loaded connection terminal. By adopting the spring loaded connection terminals, the first connection terminal 93 and the second connection terminal 94 can be connected to the signal output terminal 151 and the signal feed-in terminal 152 without using the ipex interfaces.

Meanwhile, with the spring loaded connection terminals, a length of an antenna transmission line between the NFC antenna and the antenna radiation signal source 15 can be reduced, so that the cost of the NFC antenna can be reduced, and the signal interference of the internal circuits of the display product to the NFC antenna can be weakened.

In the display module provided by the embodiments of the present disclosure, by respectively bonding and connecting the two first impedance-test bonding terminals 3 connected to the antenna radiation structure 4 to the second impedance-test bonding terminals 8 connected to the antenna receiving structure 9 in one-to-one correspondence, the antenna radiation structure 4 and the antenna receiving structure 9 can form the NFC antenna through the first impendence-test bonding terminals 3 and the second impendence-test bonding terminals 8 which are bonded and connected, that is, the bonding impedance test circuit originally formed in the display module in the related art is also used as the NFC antenna, which obviates the need to attach the NFC antenna to the back of the case of the display module, so that the thickness of the display module is not increased, and the ultra-thin display module can be realized.

In a second aspect, the embodiments of the present disclosure further provide a display device, including the display module described in the above embodiments.

By adopting the display module described in the above embodiments, a need to attach an NFC antenna to a back of a case of the display device is obviated, so that a thickness of the display device is not increased, and the ultra-thin display device can be realized.

The display device provided by the embodiments of the present disclosure may be any product or component with a display function, such as an OLED panel, an OLED television, an OLED billboard, a display, a mobile phone, or a navigator.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A display module having a display region and a bonding region, wherein the bonding region is at a side of the display region and adjoins the display region;
the display module comprises a display substrate and a flexible printed circuit board;
the display substrate comprises a first base substrate, a plurality of first bonding terminals, a plurality of first impedance-test bonding terminals, and at least one antenna radiation structure;
the plurality of first bonding terminals, the plurality of first impedance-test bonding terminals, and the at least one antenna radiation structure are on the first base substrate and within the bonding region;
the plurality of first impedance-test bonding terminals are at at least one end of a straight line formed by arrangement of the plurality of first bonding terminals;
the flexible printed circuit board comprises a second base substrate, a plurality of second bonding terminals, a plurality of second impedance-test bonding terminals, and at least one antenna receiving structure;
the plurality of second bonding terminals, the plurality of second impedance-test bonding terminals, and the at least one antenna receiving structure are on the second base substrate and within the bonding region;

the plurality of second impedance-test bonding terminals are at at least one end of a straight line formed by arrangement of the plurality of second bonding terminals;

the plurality of first bonding terminals are bonded and connected to the plurality of second bonding terminals;

the plurality of first impedance-test bonding terminals are bonded and connected to the plurality of second impedance-test bonding terminals;

the antenna radiation structure has one end connected to one first impedance-test bonding terminal and the other end connected to another first impedance-test bonding terminal;

the antenna receiving structure has one end connected to one second impedance-test bonding terminal and the other end connected to another second impedance-test bonding terminal; and the two first impedance-test bonding terminals connected to the antenna radiation structure are respectively bonded and connected to the two second impedance-test bonding terminals connected to the antenna receiving structure in one-to-one correspondence.

2. The display module of claim 1, wherein the antenna radiation structure is on a side of the plurality of first bonding terminals close to the first impedance-test bonding terminals;

the antenna radiation structure comprises a spiral wire, a first connection line, and a second connection line;

one end of the spiral wire is connected to the first connection line, and the first connection line is connected to the one first impedance-test bonding terminal; and the other end of the spiral wire is connected to the second connection line, and the second connection line is connected to the another first impedance-test bonding terminal.

3. The display module of claim 2, wherein the first connection line and the second connection line are on a same insulating film layer on the first base substrate; and the spiral wire and the first connection line are on different insulating film layers on the first base substrate.

4. The display module of claim 3, wherein the spiral wire and the plurality of first impedance-test bonding terminals are on a same insulating film layer on the first base substrate; or the spiral wire and the plurality of first impedance-test bonding terminals are on different insulating film layers on the first base substrate.

5. The display module of any claim 1, wherein the plurality of first bonding terminals and the plurality of first impedance-test bonding terminals are in a surface layer of the display substrate on a display side.

6. The display module of claim 1, wherein the antenna receiving structure is on a side of the plurality of second bonding terminals close to the second impedance-test bonding terminals;

the antenna receiving structure comprises a third connection line, a fourth connection line, a first connection terminal, and a second connection terminal;

the third connection line has one end connected to the one second impedance-test bonding terminal and the other end connected to the first connection terminal; and the fourth connection line has one end connected to the another second impedance-test bonding terminal and the other end connected to the second connection terminal.

7. The display module of claim 6, wherein the third connection line and the fourth connection line are on a same insulating film layer on the second base substrate;

the first connection terminal and the second connection terminal are on a same insulating film layer on the second base substrate; and the third connection line and the first connection terminal are on different insulating film layers on the second base substrate.

8. The display module of claim 7, wherein the first connection terminal and the second connection terminal are in a surface layer of the flexible printed circuit board on a first side;

the plurality of second bonding terminals and the plurality of second impedance-test bonding terminals are in a surface layer of the flexible printed circuit board on a second side; and the first side and the second side of the flexible printed circuit board are opposite to each other.

9. The display module of claim 8, further comprising a heat dissipation layer on a back side of the display substrate away from a display side of the display substrate;

the heat dissipation layer comprises a nonmetal sublayer and a metal sublayer stacked in a direction departing from the display substrate;

the bonding region of the display substrate is bent to the back side of the display substrate and on a side of the heat dissipation layer away from the display substrate;

an orthographic projection of the antenna radiation structure on the first base substrate falls within the heat dissipation layer; and the orthographic projection of the antenna radiation structure on the first base substrate overlaps the nonmetal sublayer, but does not overlap the metal sublayer.

10. The display module of claim 9, wherein the heat dissipation layer further comprises an insulating adhesive layer on a side of the nonmetal sublayer away from the display substrate;

the orthographic projection of the antenna radiation structure on the first base substrate is coincident with the insulating adhesive layer; and a surface of the insulating adhesive layer away from the nonmetal sublayer is flush with a surface of the metal sublayer away from the nonmetal sublayer.

11. The display module of claim 10, further comprising an attaching layer between the bonding region of the display substrate bent to the back side of the display substrate and the heat dissipation layer to attach the bonding region of the display substrate bent to the back side of the display substrate and the heat dissipation layer together;

a region of the attaching layer corresponding to the antenna radiation structure is provided with an opening; and the opening penetrates through the attaching layer along a thickness direction of the attaching layer.

12. The display module of claim 9, wherein the flexible printed circuit board is on the side of the heat dissipation layer away from the display substrate, and an orthographic projection of the flexible printed circuit board on the display substrate overlaps the heat dissipation layer; and the first connection terminal and the second connection terminal are on a surface of the flexible printed circuit board away from the display substrate.

13. The display module of claim 12, further comprising an antenna radiation signal source on a side of the flexible printed circuit board away from the display substrate;
- the antenna radiation signal source comprises a signal output terminal and a signal feed-in terminal; and
- the signal output terminal is connected to the first connection terminal, and the signal feed-in terminal is connected to the second connection terminal.

14. The display module of claim 13, wherein each of the first connection terminal and the second connection terminal is a spring loaded connection terminal; and each of the signal output terminal and the signal feed-in terminal is a spring loaded connection terminal.

15. A display device, comprising the display module of claim 1.

16. The display module of any claim 2, wherein the plurality of first bonding terminals and the plurality of first impedance-test bonding terminals are in a surface layer of the display substrate on a display side.

17. The display module of any claim 3, wherein the plurality of first bonding terminals and the plurality of first impedance-test bonding terminals are in a surface layer of the display substrate on a display side.

18. The display module of any claim 4, wherein the plurality of first bonding terminals and the plurality of first impedance-test bonding terminals are in a surface layer of the display substrate on a display side.

\* \* \* \* \*